(12) United States Patent
Weber et al.

(10) Patent No.: US 9,484,399 B2
(45) Date of Patent: Nov. 1, 2016

(54) CHARGE COMPENSATION DEVICE AND MANUFACTURING THEREFOR

(71) Applicant: Infineon Technologies Austria AG, Villach (AT)

(72) Inventors: Hans Weber, Bayerisch Gmain (DE); Daniel Tutuc, St. Niklas an der Drau (AT); Andreas Voerckel, Finkenstein (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/735,339

(22) Filed: Jun. 10, 2015

(65) Prior Publication Data

US 2016/0005811 A1    Jan. 7, 2016

(30) Foreign Application Priority Data

Jul. 1, 2014 (DE) ........................ 10 2014 109 208

(51) Int. Cl.
*H01L 21/78* (2006.01)
*H01L 29/16* (2006.01)
(Continued)

(52) U.S. Cl.
CPC ......... *H01L 29/0634* (2013.01); *H01L 21/266* (2013.01); *H01L 21/26513* (2013.01); *H01L 21/308* (2013.01); *H01L 21/768* (2013.01); *H01L 21/78* (2013.01); *H01L 23/585* (2013.01); *H01L 29/0611* (2013.01); *H01L 29/1095* (2013.01); *H01L 29/16* (2013.01); *H01L 29/7811* (2013.01)

(58) Field of Classification Search
CPC ... H01L 29/808; H01L 21/337; H01L 29/06; H01L 21/762; H01L 29/36; H01L 29/66; H01L 29/78; H01L 29/7827; H01L 29/66666; H01L 21/78; H01L 21/266; H01L 21/308; H01L 21/768; H01L 23/585; H01L 29/16; H01L 29/1095; H01L 29/0634; H01L 29/0611; H01L 21/26513; H01L 29/66712
See application file for complete search history.

(56) References Cited

U.S. PATENT DOCUMENTS 6,498,368 B2    12/2002  Sakamoto et al.
6,836,001 B2 *  12/2004  Yamauchi ........... H01L 29/0634
                                                    257/330

(Continued)

FOREIGN PATENT DOCUMENTS

JP          2001127289 A     5/2001

*Primary Examiner* — Fazli Erdem
(74) *Attorney, Agent, or Firm* — Eschweiler & Associates, LLC

(57) ABSTRACT

A charge-compensation semiconductor device includes a semiconductor body having a first surface, a lateral edge delimiting the semiconductor body in a horizontal direction substantially parallel to the first surface, an active area, and a peripheral area arranged between the active area and the lateral edge. A source metallization is arranged on the first surface. A drain metallization is arranged opposite to the source metallization. The semiconductor body further includes a drift region in Ohmic contact with the drain metallization, and a plurality of compensation regions forming respective pn-junctions with the drift region, which are arranged in the active area and in the peripheral area, and are in Ohmic contact with the source metallization via respective body regions arranged in the active area and having a higher doping concentration than the compensation regions. In a horizontal cross-section substantially parallel to the first surface the compensation regions are at least in a respective portion shaped as a strip oriented in a direction which is tilted with respect to the lateral edge by a tilt angle.

15 Claims, 11 Drawing Sheets

(51) Int. Cl.
*H01L 29/06* (2006.01)
*H01L 21/265* (2006.01)
*H01L 21/266* (2006.01)
*H01L 21/308* (2006.01)
*H01L 21/768* (2006.01)
*H01L 23/58* (2006.01)
*H01L 29/10* (2006.01)
*H01L 29/78* (2006.01)

(56) References Cited

U.S. PATENT DOCUMENTS

| | | | | |
|---|---|---|---|---|
| 7,829,972 B2* | 11/2010 | Hirler | ............... | H01L 29/0619 257/510 |
| 2012/0286355 A1* | 11/2012 | Mauder | ............... | H01L 21/0228 257/330 |
| 2013/0037906 A1* | 2/2013 | Hirler | ............... | H01L 21/761 257/506 |
| 2014/0306283 A1* | 10/2014 | Nakajima | ............... | H01L 29/7827 257/329 |

* cited by examiner

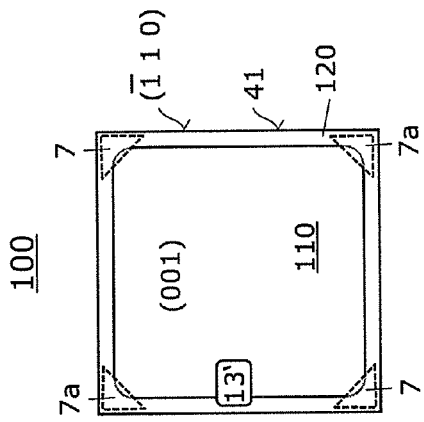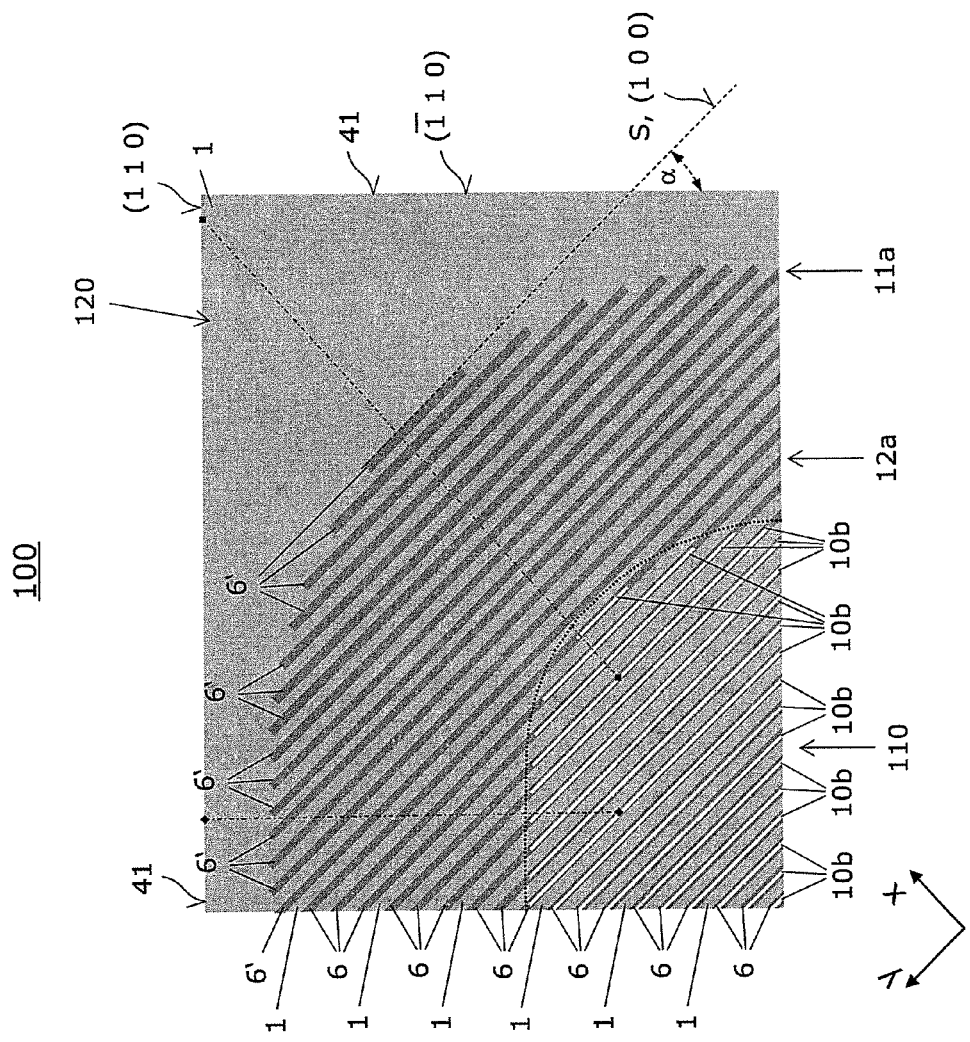

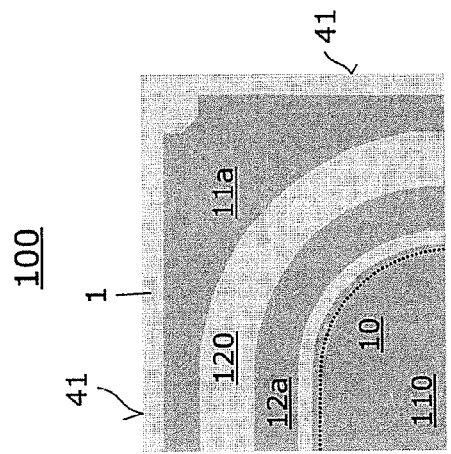
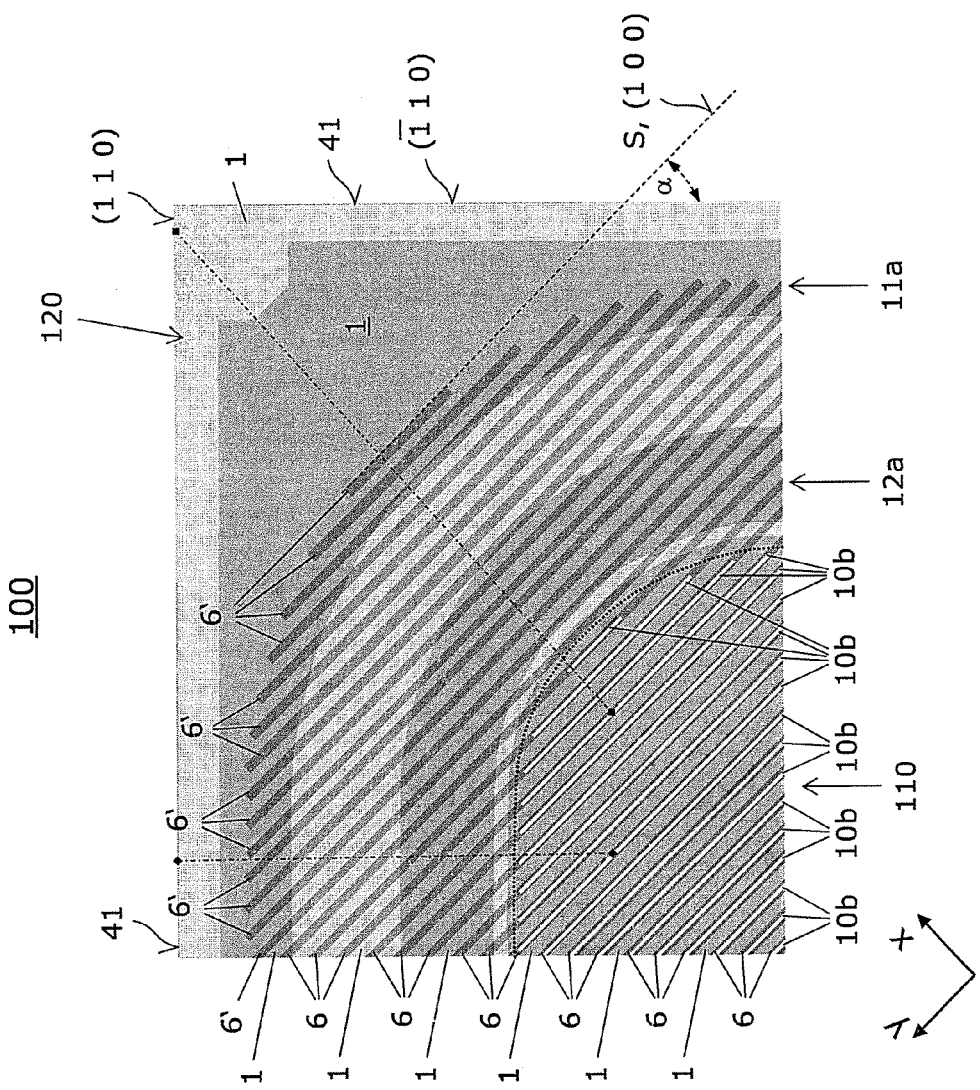

CHARGE COMPENSATION DEVICE AND MANUFACTURING THEREFOR

CROSS REFERENCE TO RELATED APPLICATIONS

This application claims priority to German Application number 102014109208.2 filed on Jul. 1, 2014, which is hereby incorporated by reference in its entirety.

FIELD

Embodiments of the present invention relate to field-effect semiconductor devices having a charge compensation structure and manufacturing methods therefor, in particular to power semiconductor devices having in an active area a charge compensation structure.

BACKGROUND

Semiconductor transistors, in particular field-effect controlled switching devices such as a Metal Oxide Semiconductor Field Effect Transistor (MOSFET) or an Insulated Gate Bipolar Transistor (IGBT), have been used for various applications including but not limited to use as switches in power supplies and power converters, electric cars, air-conditioners, and even stereo systems. Particularly with regard to power devices capable of switching large currents and/or operating at higher voltages, low on-state resistance Ron, high breakdown voltages $U_{bd}$, high robustness and/or good softness are often desired.

To achieve low on-state resistance Ron and high breakdown voltages $U_{bd}$, compensation semiconductor devices were developed. The compensation principle is based on a mutual compensation of charges in n- and p-doped regions, which are often also referred to as n- and p-doped pillar regions, in the drift zone of a vertical MOSFET.

Typically, the charge compensation structure formed by p-type and n-type regions is arranged below the actual MOSFET-structure, with its source, body regions and gate regions, and also below the associated MOS-channels that are arranged next to one another in the semiconductor volume of the semiconductor device or interleaved with one another in such a way that, in the off-state, their charges can be mutually depleted and that, in the activated state or on-state, there results an uninterrupted, low-impedance conduction path from a source electrode near the surface to a drain electrode arranged on the back side.

By virtue of the compensation of the p-type and n-type dopings, the doping of the current-carrying region can be significantly increased in the case of compensation components, which results in a significant reduction of the on-state resistance Ron despite the loss of a current-carrying area. The reduction of the on-state resistance Ron of such semiconductor power devices is associated with a reduction of the heat generated by the current in the on-state, so that such semiconductor power devices with charge compensation structure remain "cool" compared with conventional semiconductor power devices.

Meanwhile, switching losses $E_{SL}$ of power semiconductor devices have become more important. For power compensation devices, both "normal" losses $E_{OSS}$ which are due to the output charge $Q_{OSS}$ stored in the space charge region formed in the off-state and during reverse bias, respectively, and so-called passive losses (sometimes also referred to as parasitic losses) $E_{pas}$ which are due to floating semiconductor regions (floating p-doped pillar regions) in a peripheral area may contribute to the switching losses ($E_{SL}=E_{OSS}+E_{pas}$). To ensure high breakdown voltages $U_{bd}$, floating p-doped pillar regions are often used in the peripheral area surrounding the active area with active MOSFET-cells of vertical power compensation devices. If the floating p-doped pillar regions are depleted during the off-state, the holes have to flow through low-doped (high resistive) n-type semiconductor regions. This may result in comparatively high passive losses $E_{pas}$.

Accordingly, there is a need to improve semiconductor devices with charge compensation structures and manufacturing of those semiconductor devices.

SUMMARY

According to an embodiment of a charge-compensation semiconductor device, the charge-compensation semiconductor device includes a semiconductor body having a first surface, a lateral edge delimiting the semiconductor body in a horizontal direction substantially parallel to the first surface, an active area, and a peripheral area arranged between the active area and the lateral edge. A source metallization is arranged on the first surface. A drain metallization is arranged opposite to the source metallization. The semiconductor body further includes a drift region in Ohmic contact with the drain metallization and compensation regions each of which forms a pn-junction with the drift region, is arranged in the active area and in the peripheral area, and is in Ohmic contact with the source metallization via a respective body region which is arranged in the active area and has a higher doping concentration than the compensation regions. In a horizontal cross-section substantially parallel to the first surface the compensation regions are at least in a respective portion shaped as a strip oriented in a direction which is tilted with respect to the lateral edge by a tilt angle.

According to an embodiment of a charge-compensation semiconductor device, the charge-compensation semiconductor device includes a semiconductor body having a first surface, a lateral edge delimiting the semiconductor body in a horizontal direction substantially parallel to the first surface, an active area, and a peripheral area arranged between the active area and the lateral edge. A source metallization is arranged on the first surface. A drain metallization is arranged opposite to the source metallization. The semiconductor body further includes a drift region of a first conductivity type in Ohmic contact with the drain metallization, and a plurality of compensation regions of a second conductivity type which are embedded in the drift region and extend from the active area into the peripheral area. In a vertical cross-section substantially perpendicular to the first surface, the compensation regions alternate with portions of the drift region. Each of the compensation regions is in Ohmic contact with the source metallization via a respective body region of the second conductivity type having a higher doping concentration than the compensation regions. The compensation regions are substantially parallel to a plane which is substantially orthogonal to the first surface and forms an acute angle with the lateral edge.

According to an embodiment of a method for manufacturing charge-compensation semiconductor device, the method includes providing a wafer including a first surface and a drift region of a first conductivity type extending to the first surface; defining active device areas each of which is surrounded by a respective peripheral device area; and forming a mask on the first surface. When seen from above, the mask includes strip-shaped openings which are substantially parallel to each other and extend from one of the active device areas into the respective peripheral device area or v-shaped openings with two arms extending from the active device area into the respective peripheral device area. The method further includes forming compensation regions of a second conductivity type; forming a source metallization on the first surface in Ohmic contact with the compensation regions; forming a drain metallization opposite to the source metallization and in Ohmic contact with the drift region; and separating the wafer into individual charge-compensation semiconductor devices, so that at least one of the charge-compensation semiconductor devices comprises an lateral edge which delimits the charge-compensation semiconductor device in a horizontal direction substantially parallel to the first surface and forms an acute angle with the sidewalls of the vertical trenches. Forming the compensation regions comprises etching trenches from the first surface into the drift region using the mask so that each trench includes a sidewall which is substantially perpendicular to the first surface, filing the trenches with a semiconductor material of a second conductivity type using epitaxial depositing, and/or implanting dopants of the second conductivity type into the drift region using the mask as implantation mask.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIG. 2A illustrates a section of a horizontal cross-section through the semiconductor body of the semiconductor device illustrated in FIG. 1 according to an embodiment;

FIG. 2B illustrates a top view of the active area and the peripheral area of the semiconductor device illustrated in FIGS. 1, 2A according to an embodiment;

FIG. 3A illustrates a top view of the metallizations arranged on a first surface of the semiconductor body of the semiconductor device illustrated in FIGS. 1 to 2B according to an embodiment;

FIG. 3B illustrates an overlay of FIGS. 2A and 3A;

DETAILED DESCRIPTION

Figure 1:
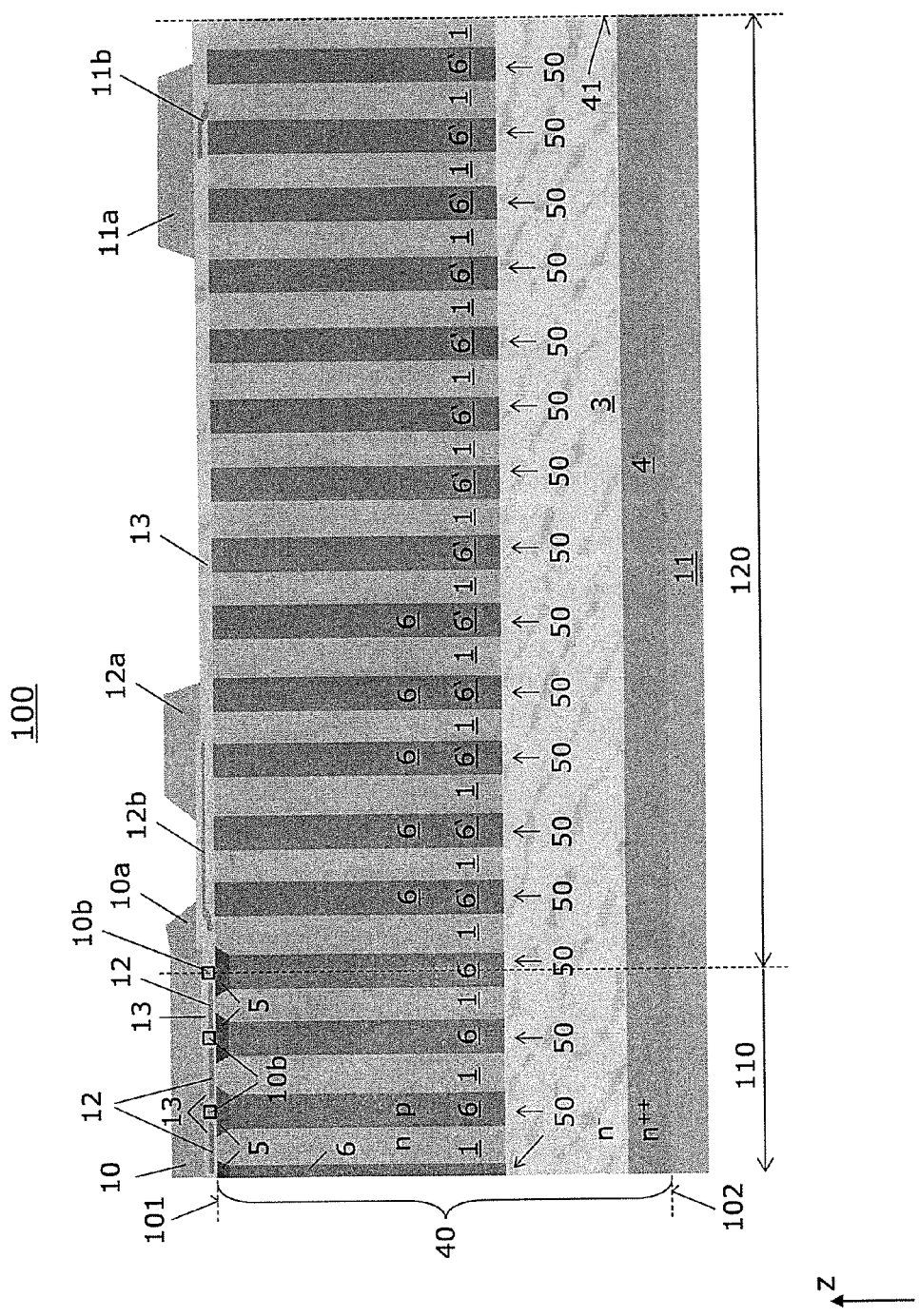
FIG. 1 illustrates a vertical cross-section through a semiconductor body of a semiconductor device according to an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body. Likewise, the term "horizontal" as used in this specification intends to describe an orientation which is substantially arranged parallel to the first surface.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped.

Furthermore, some figures illustrate relative doping concentrations by indicating "−" or "+" next to the doping type. For example, "$n^-$" means a doping concentration which is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

Specific embodiments described in this specification pertain to, without being limited thereto, to field-effect semiconductor devices, in particular to field-effect compensation semiconductor devices and manufacturing methods therefor. Within this specification the terms "semiconductor device" and "semiconductor component" are used synonymously. The field-effect semiconductor device is typically a vertical semiconductor device such as a vertical MOSFET with a source metallization and an insulated gate electrode arranged on the first surface and a drain metallization arranged on a second surface arranged opposite to the first surface. Typically, the field-effect semiconductor device is a power semiconductor device having an active area with a plurality of MOSFET-cells for carrying and/or controlling a load current. Furthermore, the power semiconductor device has typically a peripheral area with at least one edge-termination structure at least partially surrounding the active area when seen from above.

The term "power semiconductor device" as used in this specification intends to describe a semiconductor device on a single chip with high voltage and/or high current switching capabilities. In other words, power semiconductor devices are intended for high current, typically in the Ampere range and/or voltages of more than about 10 V or even more than about 100 V or about 500 V. Within this specification the terms "power semiconductor device" and "power semiconductor component" are used synonymously.

The term "edge-termination structure" as used in this specification intends to describe a structure that provides a transition region in which the high electric fields around an active area of the semiconductor device change gradually to the potential at or close to the edge of the device and/or between a reference potential such as ground and a high voltage e.g. at the edge and/or backside of the semiconductor device. The edge-termination structure may, for example, lower the field intensity around a termination region of a rectifying junction by spreading the electric field lines across the termination region.

The term "field-effect" as used in this specification intends to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between a source region of the first conductivity type and a drift region of the first conductivity type. The drift region may be in contact with a drain region. The drift region and the drain region are in low Ohmic contact with a drain electrode (drain metallization). The source region is in low Ohmic contact with a source electrode (source metallization). In the context of the present specification, the term "in Ohmic contact" intends to describe that there is a low-ohmic ohmic current path between respective elements or portions of a semiconductor device when no voltages or only small probe voltages are applied to and/or across the semiconductor device. Within this specification the terms "in Ohmic contact", "in resistive electric contact", "electrically coupled", and "in resistive electric connection" are used synonymously.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e. the term MOSFET is used in the more general term meaning of IGFET (insulated-gate field-effect transistor) and MISFET (metal-insulator-semiconductor field-effect transistor), respectively. The term "metal" for the gate material of the MOSFET should be understood to include or comprise electrical conductive materials like e.g. metal, alloys, doped polycrystalline semiconductors and metal semiconductor compounds like metal silicides.

In the context of the present specification, the term "gate electrode" intends to describe an electrode which is situated next to, and insulated from the body region and configured to form and/or control a channel region through the body region.

In the context of the present specification, the term "field electrode" intends to describe an electrode which is arranged next to a semiconductor region, typically the drift region, partially insulated from the semiconductor region, and configured to expand a depleted portion in the semiconductor region by charging to an appropriate voltage, typically a negative voltage with regard to the surrounding semiconductor region for an n-type semiconductor region.

In the context of the present specification, the term "depletable region" or "depletable zone" is intended to describe the fact that the corresponding semiconductor region or the corresponding semiconductor zone is substantially fully depleted (substantially free of free charge carriers) during the off state of the semiconductor component with an applied reverse voltage lying above a given threshold value. For this purpose, the doping charge of the depletable region is set accordingly and, in one or more embodiments, the depletable region is a weakly doped region. In the off state, the depletable region(s) form depleted region(s), also referred to as space charge region(s), typically a contiguous depleted zone whereby the current flow between two electrodes or metallizations connected to the semiconductor body can be prevented.

In the context of the present specification, the term "mesa" or "mesa region" intends to describe a semiconductor region between two adjacent trenches extending into the semiconductor substrate or body in a vertical cross-section.

The term "commutating" as used in this specification intends to describe the switching of the current of a semiconductor device from a conducting direction in which a pn-load junction, for example the pn-junction between the body region and the drift region of a MOSFET, is forwardly biased to the opposite direction or blocking direction in which the pn-load junction is reversely biased. The term "hard commutating" as used in this specification intends to describe commutating with a speed of at least about $10^9$ V/s, more typically with a speed of at least about $5*10^9$ V/s.

The term "pn-junction" as used in this specification intends to describe the boundary surface between adjoining semiconductor regions or semiconductor portions of different conductivity type.

In the following, embodiments pertaining to semiconductor devices and manufacturing methods for forming semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body comprises a high band gap material such as SiC or GaN which has a high breakdown field strength and high critical avalanche field strength, respectively, the doping of the respective semiconductor regions can be chosen higher which reduces the on-state resistance Ron in the following also referred to as on-resistance Ron.

With reference to FIG. 1, a first embodiment of a charge-compensation semiconductor device 100 is explained. FIG. 1 illustrates a vertical cross-section through a semiconductor body 40 of the semiconductor device 100. The semiconductor body 40 extends between a first surface 101, facing a vertical direction z, and a second surface (back surface) 102 arranged opposite to the first surface 101. In a horizontal direction x that is substantially parallel to the first surface 101, the semiconductor body 40 is delimited by an edge 41, for example a sawing edge, which is substantially orthogonal to the first surface 101. In the following the edge 41 is also referred to as lateral edge 41. The semiconductor body 40 has an active area 110 and a peripheral area 120 arranged between the active area 110 and the edge 41. Typically, the peripheral area 120 surrounds the active area 110 when seen from above.

A source metallization 10 is arranged on the first surface 101. A drain metallization 11 is arranged on the second surface 102, i.e. opposite to the source metallization 10. Furthermore, a plurality of gate electrodes 12 is typically also arranged on the first surface 101 in the active area 110 and insulated from the source metallization 10 and the semiconductor body 40 by a dielectric region 13. The gate electrodes 12 are connected to a gate metallization and gate pad, respectively, that is not shown in FIG. 1. Accordingly, the semiconductor device 100 may be operated as a three-terminal device.

The semiconductor body 40 typically includes a bulk mono-crystalline material 4 and at least one epitaxial layer 3, 1 formed thereon. Using the epitaxial layer(s) 3, 1 provides more freedom in tailoring the background doping of the material since the doping concentration can be adjusted during deposition of the epitaxial layer or layers.

In the exemplary embodiment illustrated in FIG. 1, the semiconductor body 40 includes a highly doped n-type drain region 4 that extends to the second surface 102 and is in Ohmic contact with the drain metallization 11 and with an n-type field-stop region 3 that adjoins the drain region 4 and has a lower maximum doping concentration than the drain region 4. The drain region 4 and the optional field-stop region 3 are typically arranged in the active area 110 and the peripheral area 120 and may extend to the edge 41. The field-stop region 3 and the drain region 4 may extend in the vertical cross-section between two opposite lateral surfaces 41 and are in the following also referred to as field-stop layer 3 and drain layer 4, respectively. The doping concentration of the field-stop layer 3 may be lower, similar or slightly higher than the drift region 1.

A plurality of alternating n-type drift portions 1 and p-type compensation regions 6 forming respective pn-junctions with each other are arranged in the active area 110 and in the adjoining peripheral area 120. The drift portions 1 have a first maximum doping concentration, which is typically higher than the maximum doping concentration of the field-stop region 3. The drift portions 1 are in Ohmic contact with the drain metallization 11 (in the exemplary embodiment via the adjoining field-stop region 3 and the drain region 4), and may extend in the active area 110 to the first surface 101. For sake of clarity, only a few drift portions 1 and compensation regions 6 of the active area 110 are illustrated in FIG. 1.

In the following, the n-type drift portions 1 are also referred to as n-type pillar regions 1 and first pillar regions 1 (of the first conductivity type), respectively, and the p-type compensation regions 6 are also referred to as p-type pillar regions 6 and second pillar regions 6 (of the second conductivity type), respectively.

An (mathematically) integrated dopant concentration of the drift portions 1 substantially matches an integrated dopant concentration of the compensation regions 6 at least in the active area 110 (typically also in the peripheral area 120). Accordingly, the drift portions 1 and the compensation regions 6 form a pn-compensation structure 1, 6. The mean dopant concentration of the drift portions 1 and compensation regions 6, i.e., the mathematically integrated difference of the donor concentration and the acceptor concentration per volume, is typically lower than the maximum doping concentration of the field-stop region 3, more typically lower than the mean doping concentration of the field-stop region 3. Even more typically, the mean dopant concentration of the drift portions 1 and compensation regions 6 is below 10% or below 5% of the maximum dopant concentration of the drift portions 1 and/or the compensation regions 6. Even more typically, the mean dopant concentration of the drift portions 1 and compensation regions 6 is substantially zero.

In the exemplary embodiment, the p-type compensation regions 6 are, in the vertical cross-section, formed as vertically orientated pillars. Alternatively, the p-type compensation regions 6 are formed as substantially vertically orientated strip-type parallelepipeds, rectangles or ellipsoids.

The p-type compensation regions 6 may be formed in vertical trenches 50 by selective epitaxial deposition.

According to an embodiment, the doping concentrations of the p-type compensation regions 6 and the drift portions 1 are chosen such that, in the off-state, their charges can be mutually depleted and that, in the on-state, an uninterrupted, low-resistive conduction path is formed from the source metallization 10 to the drain metallization 11.

Although the overall n-type and p-type doping of the pn-compensation structure 1, 6 substantially matches, the dopant concentration may vary in the drift portions 1 and/or compensation regions 6. Typically, the compensation structure 1, 6 may have an excess of p-dopants next to the source metallization and an excess of n-dopants next to the drain metallization 11. For example, the number of acceptors per area in the p-type compensation regions 6, 6' may reduce with the distance from the source metallization and/or the number of donors per area in the drift portions 1 may increase with the distance from the source metallization (decrease with distance from the drain metallization).

The compensation regions 6 of the active area 110 are in Ohmic contact with the source metallization 10 via a respective higher p-doped body region 5 and an even higher doped p$^+$-type body contact region (not shown in FIG. 1) formed in the body region 5 and typically at the first surface 101.

According to an embodiment, a plurality of alternating drift portions 1 and compensation regions 6, 6' is arranged in the peripheral area 120. The drift portions 1 and the compensation regions 6, 6' of the peripheral area 120 may extend to the first surface 101.

While the compensation regions 6 of the active area 110 are in Ohmic contact with the source metallization 10, the compensation regions 6, 6' of the peripheral area 120 may be floating semiconductor regions, i.e. semiconductor regions that are not in Ohmic contact with the source metallization 10, the drain metallization 11 and the gate metallization. In the following, floating compensation regions are denoted by reference sign 6' and compensation regions in Ohmic contact with the source metallization 10 are denoted by reference sign 6.

Depending on the vertical cross-section, none of the compensation regions, some of the outer compensation regions or even all of the compensation regions may be floating compensation regions 6'. This will be explained in detail below with regard to FIG. 2.

The compensation regions 6, 6' may extend at least close to the lateral edge 41. A distance between an outermost of the compensation regions 6, 6' and the lateral edge 41 may be in a range from about 5% to about 95% of a distance between the active area 110 and the lateral edge 41 (in the same horizontal direction). For example, a distance between an outermost of the compensation regions 6, 6' and the lateral edge 41 may be less than about a fifth, even less than about a tens or even less than about a twenties of a distance between the active area 110 and the lateral edge 41.

Typically, two n$^+$-type source regions (not shown in FIG. 1) are formed in each of the p-type body regions 5 (except for the body region 5 at the border between the active area 110 and the peripheral area 120 which may only have one embedded source region in the active area 110).

A lower portion of the dielectric region 13 is, in the active area 110, arranged between the first surface 101 and each of the gate electrodes 12, and extends in a horizontal direction from the drift portion 1 along the body region 5 at least to the source region so that an inversion channel, which is also referred to herein as MOS-channel, may be formed by the field-effect in a channel region of the body region 5 along the lower portion(s) of the dielectric region 13 forming a gate dielectric region. Accordingly, the semiconductor device 100 may be operated as an n-channel MOSFET. In embodiments referring to p-channel MOSFET, the doping relations are reversed.

The remaining portion of the dielectric region 13 forms an interlayer dielectric between the source metallization 10 and gate electrode 12 and first surface 101, respectively.

In the exemplary embodiment, the source metallization 10 is electrically contacted with the source regions and the body contact region via source contacts 10b that may be implemented as shallow trench contacts 10b formed through the interlayer dielectric 13 and into the semiconductor body 40. In other embodiments, the source metallization 10 electrically contacts the source region and the body contact region substantially at the first surface 101.

According to another embodiment, the gate electrode(s) 12 and gate dielectric(s) 13 are formed in respective trenches extending from the first surface 101 into the semiconductor body 40. In this embodiment, the body region 5 and source regions adjoin an upper part of the respective trench while the drift portions 1 adjoin a lower part of the respective trench. In this embodiment, the drift portions 1 may not extend to the first surface 101 in the active area 110.

The active area 110 may be defined by the presence of source regions and insulated gate electrodes 12 configured to form and/or change a channel region in an adjacent the body region 5. The active area 110 may also be defined by the presence of active cells, typically MOSFET-cells, for carrying a load current between the source metallization 10 and the drain metallization 11.

As illustrated in FIG. 1, the interlayer dielectric 13 typically also covers the semiconductor body 40 in the peripheral area 120. The interlayer dielectric 13 may substantially extend to the edge 41.

A drain field plate 11a in Ohmic contact with the drain metallization 11 may be arranged on the first surface 101 and next to the edge 41 in the peripheral area 120 as equipotential region (edge termination). Further, a poly-silicon layer 11b in Ohmic contact with the drain field plate 11a and embedded in the dielectric region 13 may be arranged next to the edge 41 and between the drain field plate 11a and the first surface 101. The drain field plate 11a typically surrounds the active area 110 when seen from above and is therefore also referred to as drain ring 11a and conductive drain ring 11a, respectively.

In the exemplary embodiment, a gate field plate 12a is arranged on the first surface 101 in the peripheral area 120 and contacted with the non-shown gate metallization via a further poly-silicon layer 12b embedded in the dielectric region 13. The gate field plate 12a typically surrounds the active area 110 when seen from above and is therefore also referred to as gate ring 12a and conductive drain ring 12a, respectively. The gate field plate 12a is typically arranged between the drain field plate 11a and the source metallization 10.

Further, an outermost portion 10a of the source metallization 10 may be formed as source field plate, typically as a stepped source field plate.

The drain field plate 11a and/or the gate field plate 12a may be also be stepped, i.e., the vertical (minimum) distance of the field plates 11a and/or 12a from the first surface 101 may change substantially stepwise in horizontal direction x. In other embodiments, only one or even none of the field plate 11a, 12a is arranged on the first surface 101.

FIG. 2A illustrates an upper right section of a horizontal cross-section through the semiconductor body 40 of the semiconductor device 100 illustrated in FIG. 1. The shown cross-section is parallel to the first surface (for example a (0 0 1) surface), close to the first surface and runs through the source contacts 10b. Depending on the layout of the semiconductor device 100 and the distance between the first surface and the horizontal cross-section, the structures 10b in FIG. 2A may also correspond to body contact regions. The illustrated section of FIG. 2A typically corresponds to an upper right corner region of the semiconductor device 100 which is schematically illustrated in top view in FIG. 2B showing a typical layout of the active area 110, the peripheral area 120 and a gate pad 13'. In FIG. 2A, the border between the active area 110 and the peripheral area 120 is indicated by the dotted curve. FIG. 1 may correspond to a vertical section along line L1 or line L2. In the first instance, all compensation regions 6' of the peripheral area 120 shown in FIG. 1 are floating compensation regions 6'. In the second instance, the innermost five compensation regions 6 of the peripheral area 120 shown in FIG. 1 are in contact with the source metallization. In vertical sections which are left to line L2 (further away from the corner), all compensation regions 6 of the peripheral area 120 are typically in contact with the source metallization.

As illustrated in FIG. 2A, the p-type compensation regions 6, 6' are, in the horizontal cross-section and when seen from above, respectively, typically shaped as long strips, for example as isosceles trapezoids or parallelograms (rectangles) with an aspect ratio of typically more than about ten or even 20, and extending (oriented with its longest axis) in a direction (main direction) which is tilted with respect to the lateral edge 41 by a tilt angle α. The main direction of the p-type compensation region may be defined as the direction of a longest axis of the compensation region 6 in the horizontal cross-section, as the direction of the longest line of a substantially rectangular pn-junction formed between the compensation region 6 and the drift region 1 in the horizontal cross-section or as the direction of the longest line of a minimal rectangular bounding box of the compensation region 6 in the horizontal cross-section.

In embodiments, referring to silicon semiconductor devices the first surface may be a (0 0 1) surface. In these embodiments, the lateral edge 41 may be formed by two (1 1 0)-surfaces of the semiconductor body 40 and two (−1 1 0)-surfaces ((1 1 0)-surfaces) of the semiconductor body 40 which is typically shaped as a rectangle when seen from above. The first surface may also be formed by a (1 0 0) surface.

The tilt angle α is typically an acute angle in a range from about 10° to about 80°, more typically in a range from about 30° to about 60°, even more typically in a range from about 40° to about 50°. In the exemplary embodiment, the tilt angle α is 45° as indicated by the (1 0 0)-plane S in FIG. 2A.

In the exemplary embodiment, all compensation regions 6, 6' are shaped as elongated parallel strips when seen from above and parallel to the plane S, respectively.

Further, the shown corner of semiconductor body 40 in FIG. 2A is formed by the adjoining lateral surfaces (1 1 0) and (−1 1 0) which are orthogonal to the first surface and to each other. Accordingly, the main direction of the compensation regions 6, 6' is tilted with respect to each of the two lateral surfaces (1 1 0) and (−1 1 0) forming a corner region of semiconductor body 40 with floating compensation regions 6'.

Due to using a design with substantially plate-shaped and parallel compensation regions 6, 6' (parallel stripes in the horizontal cross-section) which are tilted with respect to the lateral edge 41, several compensation regions (6) extends into opposite corner region (7a) next to two adjoining lateral surfaces 41 of the semiconductor body 40. Thus, floating compensation regions 6' are only formed in two diagonally opposite corner regions 7 of the peripheral area 120 as illustrated in FIG. 2B. Accordingly, the area of the peripheral area with floating compensation regions 6' is significantly reduced in particular for tilt angle α at or near 45°. Thus, the passive losses $E_{pas}$ may significantly be reduced. Taking into account volume effects, $E_{pas}$ may be reduced by up to about 90% using 45° tilted compensation regions 6, 6'.

Furthermore, the on-state resistance Ron may be reduced in parallel. This is because at least a part of the peripheral area 120 may be used as current path of the electrons in forward mode as the electrons which are injected from the channel in the semiconductor volume may also spread towards the chip edge 41.

Note that areas with floating compensation regions are areas with comparatively large resistance for holes during switching and for electrons in forward mode.

Due to the reduced Ron, the semiconductor device 100 may be used in applications with rare or none avalanche events, such as in resonant circuits, as well as in hard switching applications. In hard switching applications, the floating part of the peripheral are is discharged at the first cycles and then remains in the off-state. Therefore, Epas is typically anyway low in hard switching applications. In resonant circuits, the low Epas of the semiconductor device 100 during operation is of more importance as the floating area 7 is flooded with charge carriers during each switching cycle resulting in corresponding switching losses $E_{pas}$.

FIG. 3B shows an overlay of the horizontal cross-section through the semiconductor body 40 of the semiconductor device 100 illustrated in FIG. 2a with the source metallization 10, the gate ring 12a and the drain ring 11a as shown in FIG. 3A.

Figure 4:
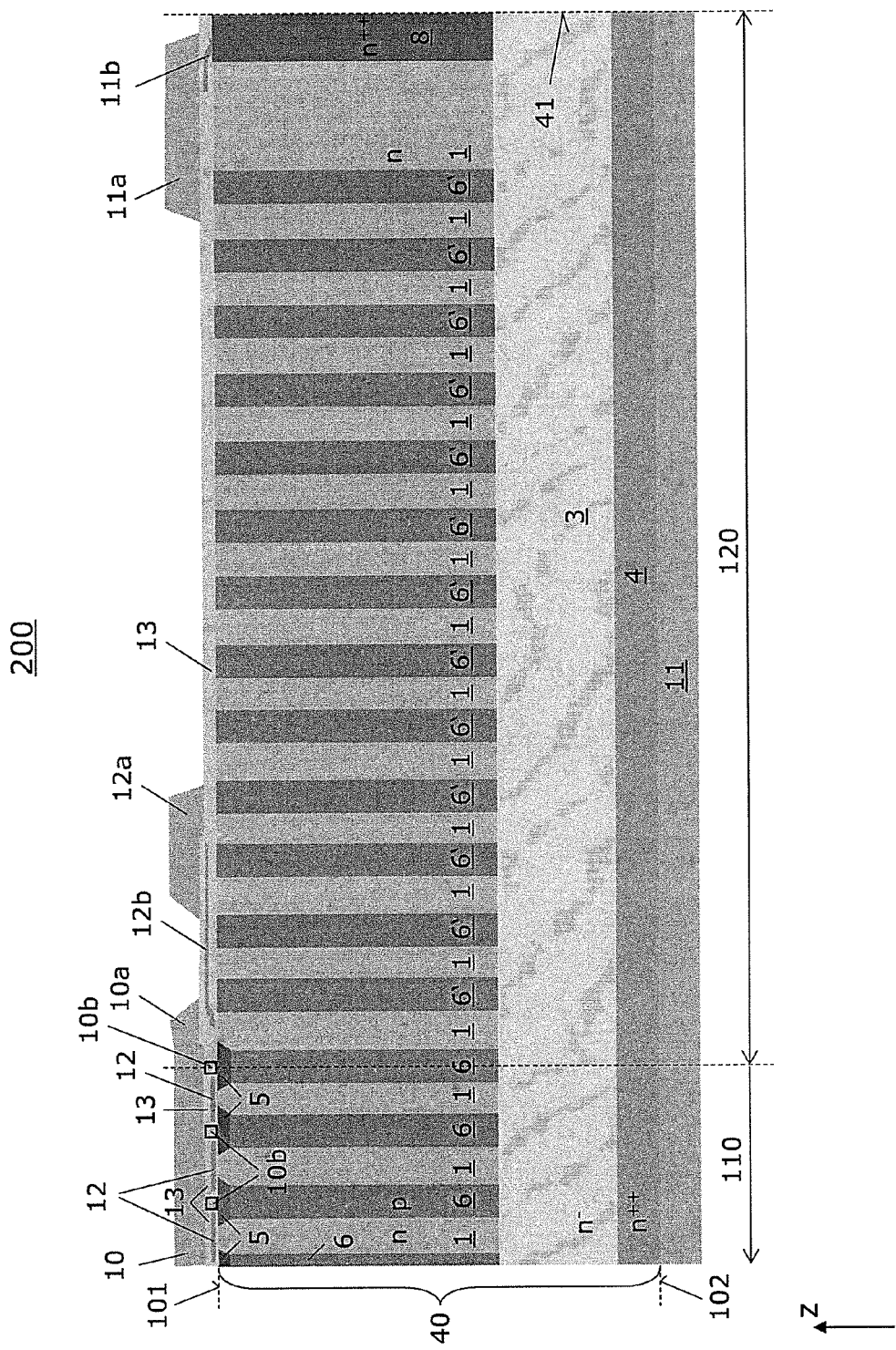
FIG. 4 illustrates a vertical cross-section through a semiconductor body of a semiconductor device according to an embodiment.

FIG. 4 illustrates a vertical cross-section through a semiconductor body 40 of a charge-compensation semiconductor device 200. The semiconductor device 200 is similar to the semiconductor device 100 explained above with regard to FIGS. 1 to 3A. However, the semiconductor body 40 of semiconductor device 200 further includes in the peripheral area 120 and between the edge 41 and an outermost drift portion 1 a highly doped field-stopper region 8 in Ohmic contact with the drain metallization 11 and forming an equipotential region. The field-stopper region 8 may also extend to the first surface 101 and/or to the drain region 4, but may also be spaced apart from the field-stop region 3 and/or the first surface 101.

Due to the field-stopper region 8, the electric field in the off-state does not, or at least almost does not, extend to the edge 41. Accordingly, a low leakage current is ensured, as crystal defects which may be caused by sawing are shielded by the highly doped field-stopper region 8.

Typically, the field plate 11a, the field plate 12a, and the field-stopper region 8 are substantially ring-shaped, for example annular when seen from above. In these embodiments, the field plate 11a and the field plate 12a form a drain ring 11a and a gate ring 12a, respectively.

Figure 5:
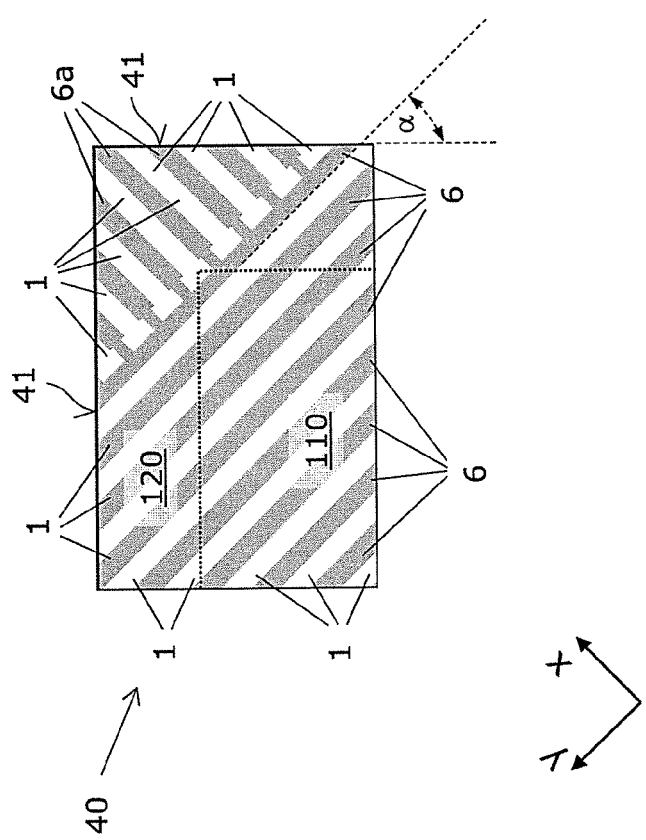
FIG. 5 illustrates a section of a horizontal cross-section through a semiconductor body of a semiconductor device according to an embodiment.

FIG. 5 illustrates a section of a horizontal cross-section through a semiconductor body 40 of a charge-compensation semiconductor device 300. The semiconductor device 200 is similar to the semiconductor device 100 explained above with regard to FIGS. 1 and 3A.

The semiconductor body 40 of the semiconductor device 300 also includes a plurality of p-type compensation regions 6 which form respective pn-junctions with the drift region 1, are partly arranged in the active area 110 (arranged in the active area 110 and in the peripheral area 120), and are in Ohmic contact with the source metallization (not shown in FIG. 5) via a respective p-type doped body region (not shown in FIG. 5 typically corresponding to a horizontal cross-section below the body regions) which is arranged in the active area 110 and has a higher doping concentration than the compensation regions 6. In the horizontal cross-section, the compensation regions 6 are at least in a respective portion shaped as a strip, for example a rectangle with high aspect ratio or rounded rectangle with high aspect ratio, which is oriented in a direction (elongated in the direction) which is tilted with respect to the lateral edge 41 by a tilt angle (a).

However, there are no floating compensation regions 6 in the peripheral area 120 of semiconductor device 300. Accordingly, $E_{pas}$ may be reduced to a lowest possible value.

Instead, the semiconductor body 40 includes, in a corner region 7 of the peripheral area 120 close to the two adjoining lateral surfaces of the lateral edge 41, p-type further compensation regions (compensation portions) 6a which form respective pn-junctions with the drift region 1, are tilted with respect to the p-type compensation regions 6 (about 90° in the exemplary embodiment) and extend to an outermost of the compensation regions 6. Typically, the semiconductor body 40 has two diagonally opposite arranged corner regions 7 with further compensation regions 6a connected via a respective outermost compensation regions 6 running through the active area 110. Note that FIG. 5 corresponds only to a section through the semiconductor body 40.

In the exemplary embodiment, the compensation regions 6 extend between two lateral surfaces of the lateral edge 41 and are formed as isosceles trapezoids when seen from above. In other embodiments, the compensation regions 6 are spaced apart from the edge and may, for example, be formed as rectangles when seen from above.

The charge-compensation semiconductor devices explained above with regard to FIG. 1 to FIG. 5 have in common that the semiconductor body 40 includes a first surface 101, a lateral edge 41 delimiting the semiconductor body 40 in a horizontal direction substantially parallel to the first surface 101, an active area 110, and a peripheral area 120 arranged between the active area 110 and the lateral edge 41. A source metallization 10 is arranged on the first surface 101, and a drain metallization 11 is arranged opposite to the source metallization 10. An n-type drift region 1 of the semiconductor body 40 is in Ohmic contact with the drain metallization 11. P-type compensation regions 6 in Ohmic contact with the source metallization 11 are embedded in the drift region 1, and extend from the active area 110 into the peripheral area 120. In a vertical cross-section, the compensation regions 6 alternate with portions of the drift region 1. The compensation regions 6 are substantially parallel to a plane S which is substantially orthogonal to the first surface 101 and forms an acute angle with the lateral edge 41. The compensation regions 6 are typically arranged in trenches 50 having sidewalls forming the acute angle with the lateral edge 41. The compensation regions 6 may be substantially plate-shaped and have a width which is much smaller than both a length and a height of the compensation region 6, respectively.

Figure 6:
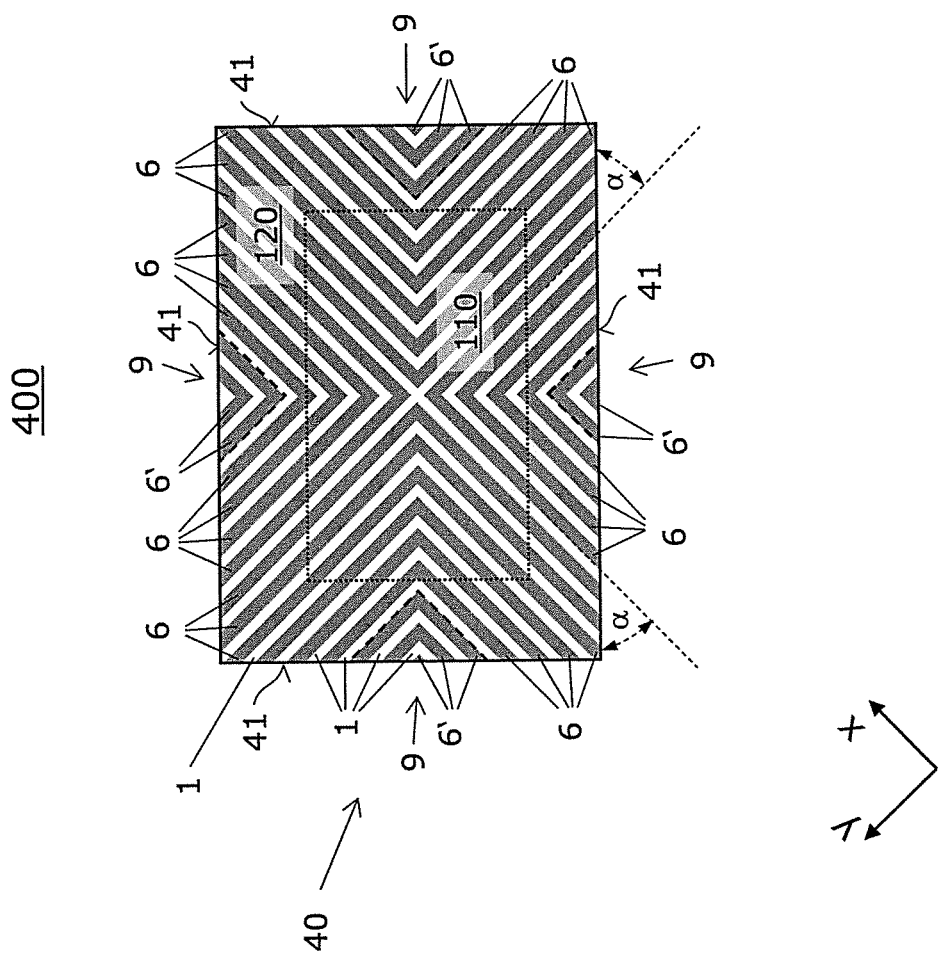
FIG. 6 illustrates a horizontal cross-section through a semiconductor body of a semiconductor device according to an embodiment; and FIG. 7A to FIG. 11 illustrates top views and vertical cross-sections through a semiconductor body, respectively, during method steps of a method according to embodiments.

FIG. 6 illustrates a horizontal cross-section through a semiconductor body 40 of a semiconductor device 400. The semiconductor device 400 is similar to the semiconductor device 100 explained above with regard to FIGS. 1 to 3A. The semiconductor body 40 of semiconductor device 400 also includes an n-type drift region 1 in Ohmic contact with the drain metallization (not shown in FIG. 6) and a plurality of p-type compensation regions 6 which form respective pn-junctions with the drift region 1, are arranged in the active area 110 and in the peripheral area 120, and are in Ohmic contact with the source metallization (not shown in FIG. 6). However, each of the p-type compensation regions 6 of the semiconductor device 400 is, in the horizontal cross-section and when seen from above, respectively, substantially v-shaped and typically formed by two adjoining strip-shaped portion (arms) each of which is oriented in a direction which is tilted with respect to the lateral edge 41 by a tilt angle α.

In the exemplary embodiment, the adjoining strip-shaped portions (arms) of the v-shaped compensation regions 6 are substantially orthogonal to each other. In other embodiments, first v-shaped compensation regions with a first interior angle of less than 90° between the arms and second v-shaped compensation regions with a second interior angle between the arms of 180° minus the first interior angle may be used.

As indicated by the dashed triangles in FIG. 6, the peripheral area 120 of semiconductor device 400 may include four comparatively small regions 9 with floating p-type compensation regions 6'. Thus, $E_{pas}$ of semiconductor device 400 is also expected to be comparatively low.

Charge compensation semiconductor devices may be produced with a so-called 'multiple epitaxy' process. In this case, an n-doped epitaxial layer, which may be several μm thick, is first grown on a highly n-doped substrate and commonly referred to as 'buffer epi'. In addition to a doping level introduced in the epitaxial step doping ions are introduced into the buffer epi through a mask using implantation with the doping ions in the first charging locations (for example boron for phosphorous doping). Counter doping can be also employed with implantation (either through a mask, or on the entire surface). However, it is also possible to separate the individual epitaxial layers with the required doping. After that, the entire process is repeated as much time as required until an n (multi-epitaxial) layer is created which has a sufficient thickness and which is equipped with charge centers. The charge centers are mutually adjusted to each other and vertically stacked on top of each other. These centers are then merged with outward thermal diffusion in an undulating, vertical column to form adjacent p-type charge compensation regions (compensation regions) and n-type charge compensation regions (drift portions). The manufacturing of the actual devices can then be conducted at this point.

Another technique for fabricating charge compensation semiconductor devices involves trench etching and compensation with trench filling. The volume which absorbs the voltage is deposited in a single epitaxial step (n-doped epi) on a highly n-doped substrate, so that the thickness corresponds to the total thickness of the multilayered epitaxial structure. After that, deep trenches are etched, which determine the form of the p-columns (compensation regions). The deep trenches are then filled with p-doped epi which is at least substantially free of crystal defects.

Both techniques may be used to manufacture the charge compensation semiconductor devices as explained above with regard to FIGS. 1 to 6.

With regard to FIG. 7A to FIG. 11 method steps of a method using the trench based technique for manufacturing a charge-compensation semiconductor device 100 are explained.

Figure 7B:
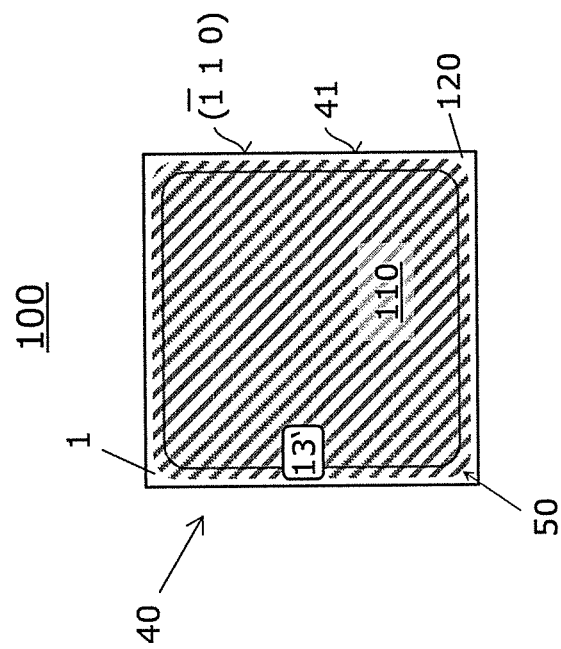
Figure 7A:
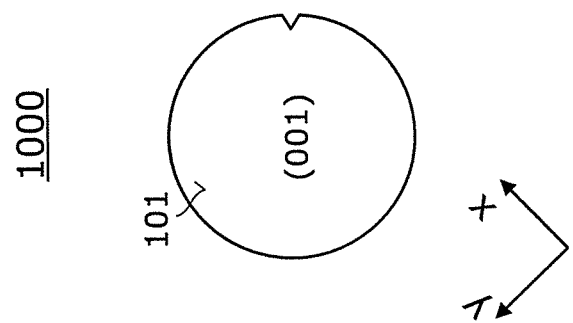

In a first step, a wafer 1000 having a first surface 101 and an n-type drift region 1 extending to the first surface 101 is provided. In embodiments referring to manufacturing of silicon semiconductor devices, the first surface 101 may e.g. be a (1 0 0) surface or a (0 0 1) surface as shown in FIG. 7A illustrating a top view on the wafer 1000. This facilitates the later epitaxial deposition.

Thereafter, active device areas 110 which are surrounded by corresponding peripheral device areas 120 are defined. FIG. 7B illustrates in a top view a typical layout of the active area 110 and the peripheral area 120 of one semiconductor device 100 of a plurality of semiconductor devices to be manufactured in parallel on wafer-level. The layout of FIG. 7B includes a layout for a gate pad 13' and a layout for trenches 50 (i.e. a negative of an etching mask) to be etched from the first surface into the semiconductor body 40. In the exemplary embodiment illustrated in FIG. 7B, the trenches 50 are shaped as parallel straight stripes when seen from above.

When seen from above, the etching mask 17 includes strip-shaped openings which are substantially parallel to each other and extend from the active device area 110 into the adjoining peripheral device area 120 when a semiconductor device as explained above with regard to FIGS. 1 to 5 is to be manufactured; or interleaved v-shaped openings with two substantially right angled arms extending from the active device area into the adjoining peripheral device area 120 when a semiconductor device as explained above with regard to FIGS. 1 to 5 is to be manufactured.

Figure 8:
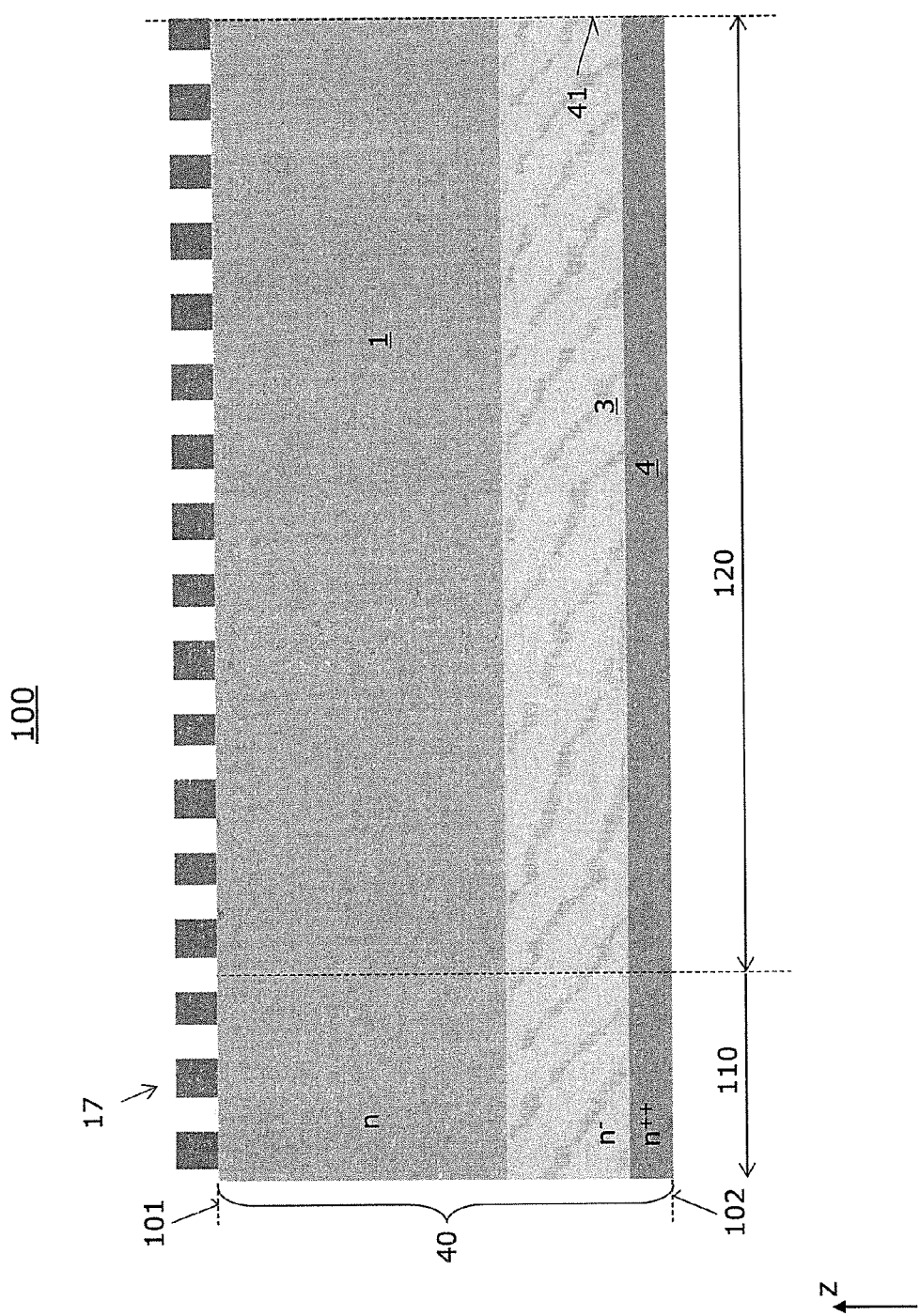

FIG. 8 shows a vertical section of the semiconductor device 100 after forming the mask 17 on the first surface 101. As illustrated in FIG. 8, the wafer 1000 typically includes a highly n-doped drain layer 4 extending to a back-surface 102 of the wafer and an n-type field-stop layer 3 arranged between the drift region 1 and the drain layer 4.

In other embodiments referring to forming the charge compensation semiconductor devices using the 'multiple epitaxy' process, the mask 17 may be used for implanting acceptor ions and an inverted mask may be used for implanting donor ions after a respective epitaxy process.

Figure 9:
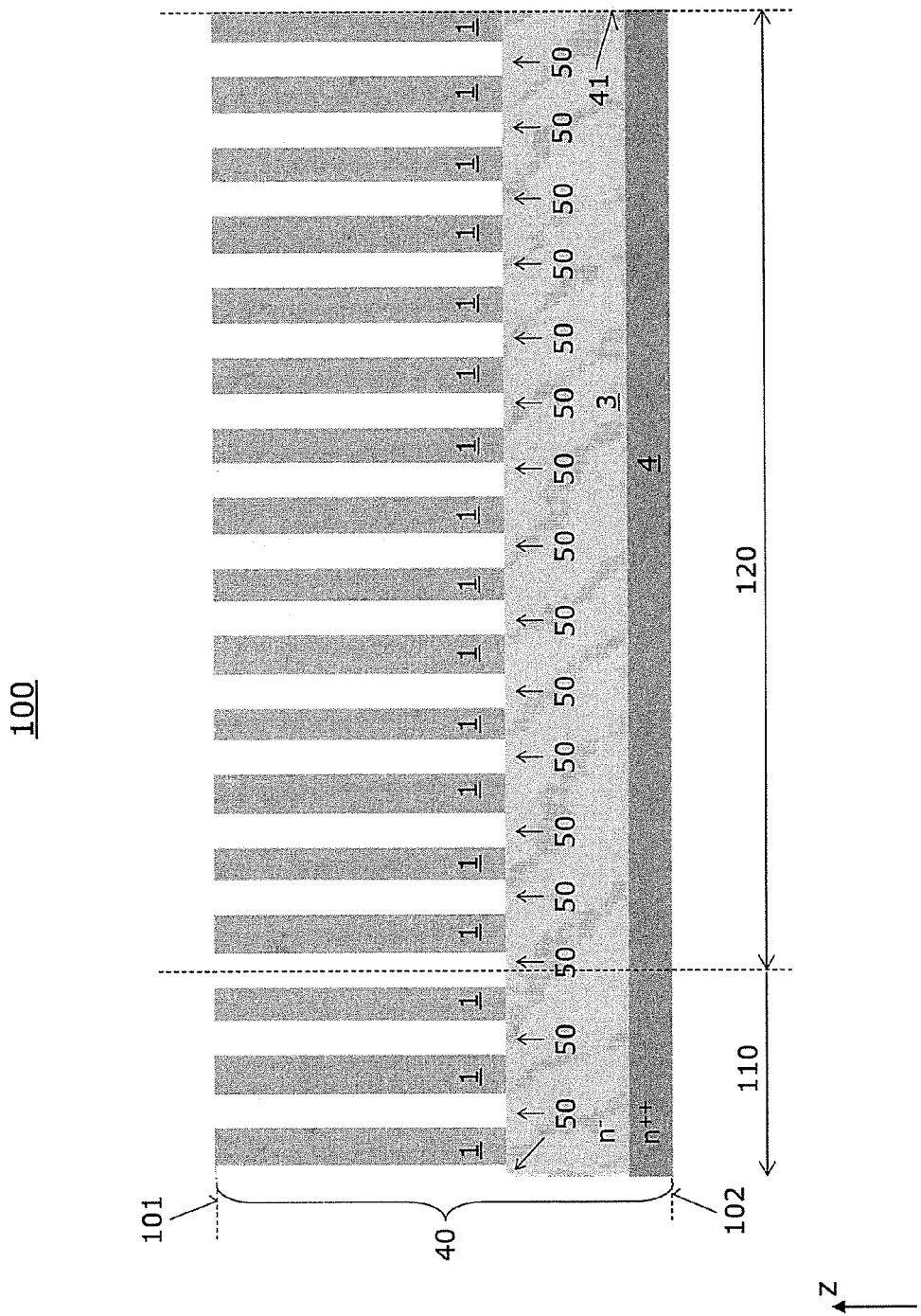

Thereafter, trenches 50 are etched from the first surface 101 into the drift region 1, typically through the drift region 1, using the mask 17 so that each trench 50 comprises sidewalls which are substantially perpendicular to the first surface 101 (vertical trenches) as shown in the vertical section illustrated in FIG. 9.

Figure 10:
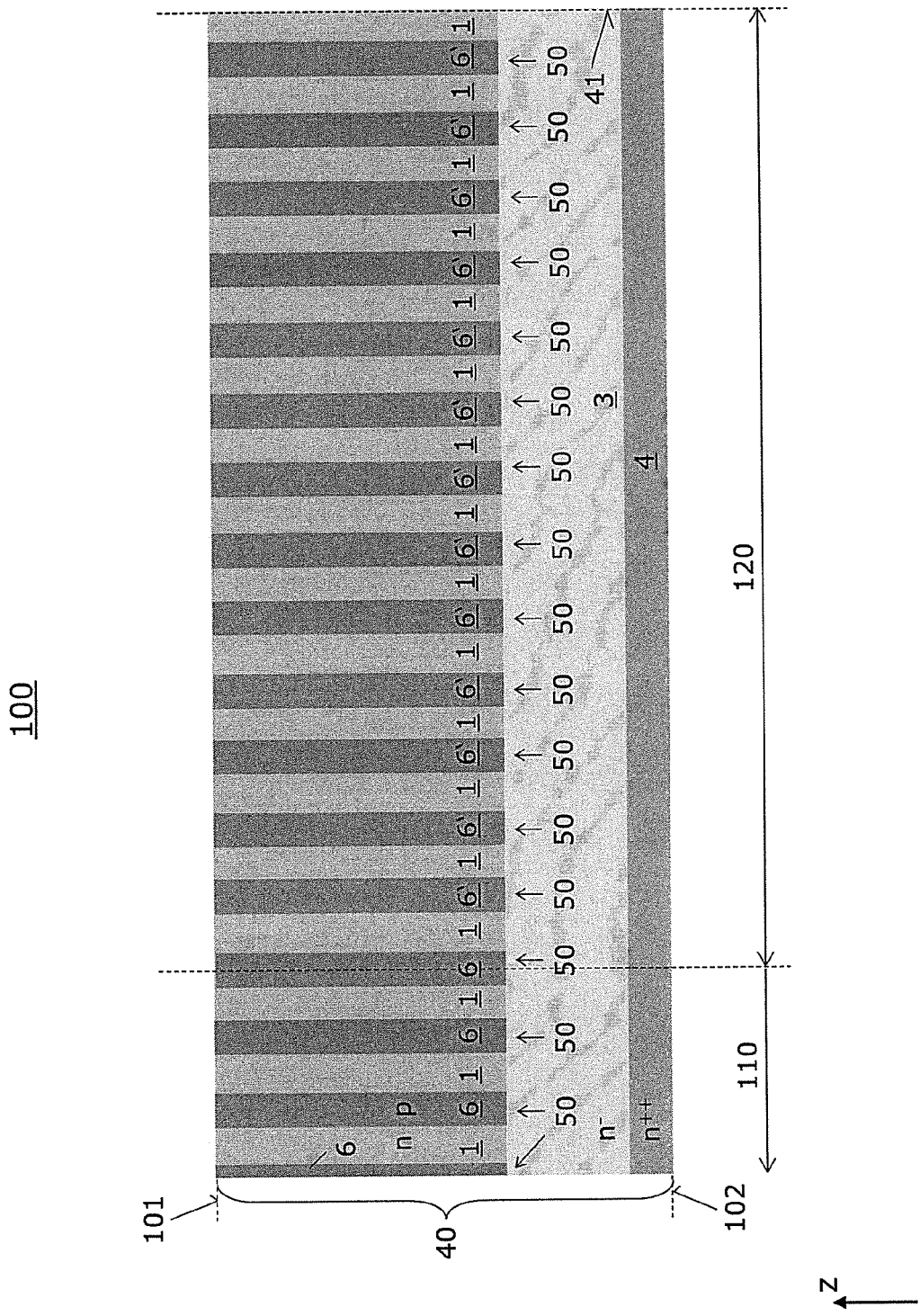

Thereafter, the trenches 50 may be filled with p-doped substantially monocrystalline semiconductor material to form compensation regions 6, 6' using selective epitaxial depositing and a subsequent polishing at the first surface 101, e.g. a CMP-process (Chemical-Mechanical Polishing). In FIG. 10, the resulting structure 100 with alternating drift portions 1 and compensation regions 6, 6' is shown in a vertical section.

Figure 11:
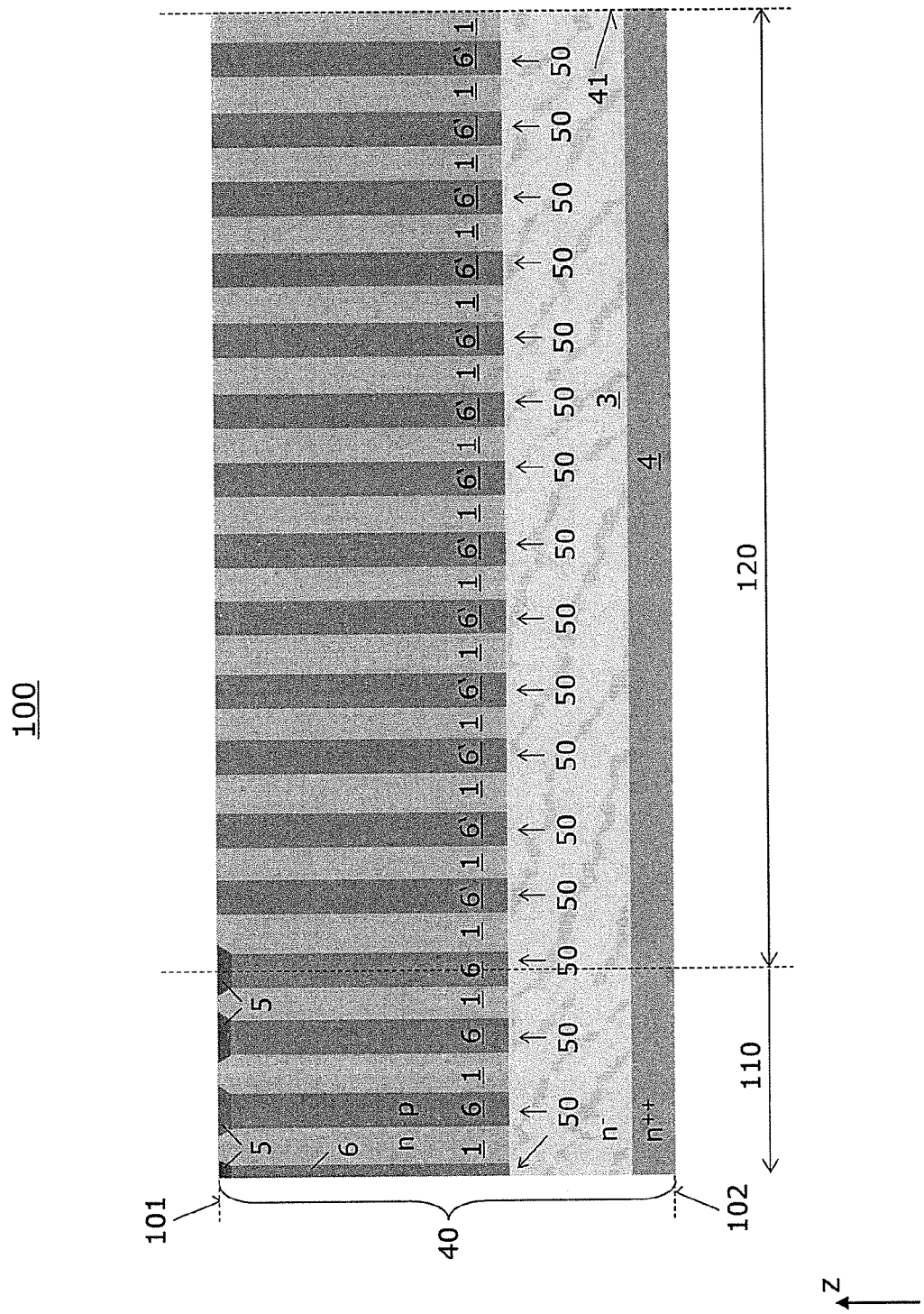

Thereafter, acceptor ions may be implanted next to the first surface 101 and into upper portions of the p-doped compensation regions in the active area 110 to form higher doped body regions 5 and body contact regions. Further, donor ions may be implanted next to the first surface 101 and into body regions 5 to form source regions. FIG. 11 illustrates the resulting structure 100 in a vertical section.

After a thermal process to activate and potentially drive in the implanted ions, a source metallization in Ohmic contact with the compensation regions 6, 6' and the source regions may be formed on the first surface 101.

Further, a drain ring and/or a gate ring arranged between the drain ring and the active device area 110 may be formed on the first surface 101 in the peripheral device areas.

Even further, insulated gate electrodes may be formed next the first surface 101 in the active device areas 110.

Thereafter, a drain metallization may be formed on the back-side 102 (opposite to the source metallization) and in Ohmic contact with the drift region 1 and drift portions 1, respectively.

Thereafter, the wafer 1000 may be separated, e.g. by sawing along sawing lines 41, into individual charge-compensation semiconductor devices 100, so that the charge-compensation semiconductor devices 100 have a corresponding lateral edge 41 which delimits the charge-compensation semiconductor device in a horizontal direction substantially parallel to the first surface 101 and forms an acute angle with the sidewalls of the vertical trenches 50.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A charge-compensation semiconductor device, comprising:
    a semiconductor body comprising a first surface, a lateral edge delimiting the semiconductor body in a horizontal direction substantially parallel to the first surface, an active area, and a peripheral area arranged between the active area and the lateral edge;
    a source metallization arranged on the first surface; and
    a drain metallization arranged opposite to the source metallization; the semiconductor body further comprising:
        a drift region in Ohmic contact with the drain metallization; and
        a plurality of compensation regions each of which forms a pn-junction with the drift region, is arranged in the active area and in the peripheral area, and is in Ohmic contact with the source metallization via a respective body region which is arranged in the active area and has a higher doping concentration than the compensation regions, in a horizontal cross-section substantially parallel to the first surface the compensation regions being at least in a respective portion shaped as a strip oriented in a direction which is tilted with respect to the lateral edge by a tilt angle.

2. The charge-compensation semiconductor device of claim 1, wherein the tilt angle is in a range from about 10° to about 80°.

3. The charge-compensation semiconductor device of claim 1, wherein the compensation regions extend close to the lateral edge.

4. The charge-compensation semiconductor device of claim 1, wherein the compensation regions are at least in the active area formed as parallel stripes in the horizontal cross-section.

5. The charge-compensation semiconductor device of claim 1, wherein the lateral edge comprises two adjoining lateral surfaces of the semiconductor body which are substantially orthogonal to the first surface and tilted with respect to each other, and wherein the direction of at least one of the compensation regions is tilted with respect to each of the two lateral surfaces.

6. The charge-compensation semiconductor device of claim 5, wherein the lateral edge further comprises two further lateral surfaces of the semiconductor body which are substantially orthogonal to the first surface and adjoin each other in a corner region of the peripheral area, and wherein at least one of the compensation regions extends into the corner region.

7. The charge-compensation semiconductor device of claim 5, wherein the semiconductor body comprises, in a corner region of the peripheral area close to the two lateral surfaces, compensation portions which form respective pn-junctions with the drift region, are tilted with respect to the compensation regions and extend to an outermost of the compensation regions.

8. The charge-compensation semiconductor device of claim 1, wherein each of the compensation regions comprise, in the horizontal cross-section, two strip-shaped portions which are angled with respect to each other.

9. The charge-compensation semiconductor device of claim 1, wherein each of the compensation regions is formed by a filled trench comprising a sidewall substantially orthogonal to the first surface.

10. The charge-compensation semiconductor device of claim 1, wherein the drift region is of a first conductivity type, further comprising at least one of a field-stop layer of the first conductivity type arranged between the drift region and the drain metallization and having a different doping concentration than the drift region, and a drain layer of the first conductivity type arranged between the field-stop layer and the drain metallization and having a higher doping concentration than the drift region.

11. The charge-compensation semiconductor device of claim 1, wherein the semiconductor body is made of silicon, and wherein the first surface is a surface of the semiconductor body or a surface of the semiconductor body, and/or wherein the compensation regions are substantially parallel to a surface of the semiconductor body.

12. A charge-compensation semiconductor device, comprising:
a semiconductor body comprising a first surface, a lateral edge delimiting the semiconductor body in a horizontal direction substantially parallel to the first surface, an active area, and a peripheral area arranged between the active area and the lateral edge;
a source metallization arranged on the first surface; and
a drain metallization arranged opposite to the source metallization;
the semiconductor body further comprising:
a drift region of a first conductivity type in Ohmic contact with the drain metallization; and
a plurality of compensation regions of a second conductivity type embedded in the drift region, and extending from the active area into the peripheral area, in a vertical cross-section substantially perpendicular to the first surface, the compensation regions alternating with portions of the drift region, wherein each of the compensation regions is in Ohmic contact with the source metallization via a respective body region of the second conductivity type having a higher doping concentration than the compensation regions, and wherein the compensation regions are substantially parallel to a plane which is substantially orthogonal to the first surface and forms an acute angle with the lateral edge.

13. The charge-compensation semiconductor device of claim 12, wherein the semiconductor body comprises in the peripheral area floating compensation regions of the second conductivity type which are embedded in the drift region and are substantially parallel to the plane.

14. The charge-compensation semiconductor device of claim 12, wherein the semiconductor body comprises in the peripheral area compensation portions of the second conductivity type which are substantially orthogonal to the plane, and adjoin the drift region and an outermost of the compensation regions extending from the active area into the peripheral area.

15. The charge-compensation semiconductor device of claim 12, wherein the acute angle is in a range from about 10° to about 80°.

* * * * *